(12) United States Patent
Wang et al.

(10) Patent No.: US 11,081,667 B2
(45) Date of Patent: Aug. 3, 2021

(54) OLED DISPLAY MOTHERBOARD WITH CRACK STOP SLITS

(71) Applicant: BOE TECHNOLOGY GROUP CO., LTD., Beijing (CN)

(72) Inventors: Dawei Wang, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 16/333,059

(22) PCT Filed: Aug. 29, 2018

(86) PCT No.: PCT/CN2018/102822
§ 371 (c)(1),
(2) Date: Mar. 13, 2019

(87) PCT Pub. No.: WO2019/042299
PCT Pub. Date: Mar. 7, 2019

(65) Prior Publication Data
US 2019/0207160 A1    Jul. 4, 2019
US 2020/0227675 A9   Jul. 16, 2020

(30) Foreign Application Priority Data

Aug. 31, 2017   (CN) .......................... 201710783592.2

(51) Int. Cl.
*H01L 51/52*   (2006.01)
*H01L 27/32*   (2006.01)
*H01L 51/56*   (2006.01)

(52) U.S. Cl.
CPC ...... *H01L 51/5253* (2013.01); *H01L 51/5256* (2013.01); *H01L 27/3244* (2013.01); *H01L 51/56* (2013.01)

(58) Field of Classification Search
CPC .................................................. H01L 51/5253
(Continued)

(56) References Cited

U.S. PATENT DOCUMENTS

| 2013/0334959 A1 | 12/2013 | Wang et al. |
| 2015/0034935 A1* | 2/2015 | Choi ................... H01L 51/5253 257/40 |
| 2016/0284770 A1 | 9/2016 | Kim |

FOREIGN PATENT DOCUMENTS

| CN | 106549116 A | 3/2017 |
| CN | 106816456 A | 6/2017 |

(Continued)

OTHER PUBLICATIONS

PCT International Search Report, Application No. PCT/CN2018/102822, dated Nov. 29, 2018, 6 pages: with English translation.
(Continued)

*Primary Examiner* — Ajay Arora
(74) *Attorney, Agent, or Firm* — Armstrong Teasdale LLP (57) ABSTRACT

The present disclosure provides an OLED display motherboard and a method for manufacturing the same, a method for manufacturing the OLED display panel, and an OLED display device thereof. The OLED display motherboard includes a base substrate having a display region and a non-display region surrounding the display region, a TFT and an OLED device located within the display region of the base substrate, at least two crack stop slits located within the non-display region of the base substrate, an extending direction of the crack stop slit being the same as an extending direction of an edge of the display region of the base substrate, and adjacent crack stop slits being separated by a crack stop slit step, and an encapsulation layer covering the crack stop slit and the OLED device. A portion of the encapsulation layer has a non-uniform thickness.

23 Claims, 4 Drawing Sheets

(58) Field of Classification Search
USPC .......................................................... 257/40
See application file for complete search history.

(56) References Cited

FOREIGN PATENT DOCUMENTS

| | | |
|---|---|---|
| CN | 106981584 A | 7/2017 |
| CN | 107591498 A | 1/2018 |
| EP | 2860785 A2 | 4/2015 |
| WO | 2015180366 A1 | 12/2015 |

OTHER PUBLICATIONS

PCT Written Opinion, Application No. PCT/CN2018/102822, dated Nov. 29, 2011, 5 pages.: with English translation of relevant part.
European Extended Search Report, Application No. 18850110.0, dated Apr. 20, 2021, 10 pps.
Indian First Examination Report, Application No. 201927034509, dated Mar. 1, 2021, 5 pps.

\* cited by examiner

OLED DISPLAY MOTHERBOARD WITH CRACK STOP SLITS

CROSS REFERENCE TO RELATED APPLICATIONS

This patent application is a National Stage Entry of PCT/CN2018/102822 filed on Aug. 29, 2018, which claims the benefit and priority of Chinese Patent Application No. 201710783592.2 filed on Aug. 31, 2017, the disclosures of which are incorporated by reference herein in their entirety as part of the present application.

BACKGROUND

Embodiments of the present disclosure relate to the field of display technologies, and in particular, to an OLED display motherboard and a method for manufacturing the same, a method for manufacturing an OLED display panel and an OLED display device thereof.

Compared with conventional liquid crystal display panel, organic light emitting diode (OLED) display panel has gradually become the mainstream application in the display field due to its advantages of fast response, wide color gamut, thin thickness, and flexibility.

BRIEF DESCRIPTION

The present disclosure provides an OLED display motherboard and a method for manufacturing the same, a method for manufacturing the OLED display panel, and an OLED display device thereof.

An aspect of the present disclosure provides an OLED display motherboard. The OLED display motherboard includes a base substrate having a display region and a non-display region surrounding the display region, a TFT and an OLED device located within the display region of the base substrate, at least two crack stop slits located within the non-display region of the base substrate, an extending direction of the crack stop slit being the same as an extending direction of an edge of the display region of the base substrate, and adjacent crack stop slits being separated by a crack stop slit step, and an encapsulation layer covering the crack stop slit and the OLED device. A portion, located on a side away from the display region of the crack stop slit furthest from the display region, of the encapsulation layer has a non-uniform thickness.

In an embodiment of the present disclosure, a thickness of an outer edge of the portion of the encapsulation layer gradually decreases in a direction away from the display region.

In an embodiment of the present disclosure, the encapsulation layer includes a first inorganic encapsulation layer, an organic encapsulation layer, and a second inorganic encapsulation layer sequentially stacked. The first inorganic encapsulation layer, the organic encapsulation layer, and the second inorganic encapsulation layer cover the OLED device, and the first inorganic encapsulation layer and the second inorganic encapsulation layer cover the crack stop slit.

Another aspect of the disclosure provides a method for manufacturing an OLED display motherboard. The method includes providing a base substrate including a display region having a TFT and a non-display region surrounding the display region, forming at least two crack stop slits within the non-display region of the base substrate, an extending direction of the crack stop slit being the same as an extending direction of an edge of the display region of the base substrate, and adjacent crack stop slits being separated by a crack stop slit step, forming a sacrificial layer on the crack stop slit step, forming an encapsulation layer to cover the crack stop slit, the sacrificial layer, and the OLED device located within the display region of the base substrate, and removing the sacrificial layer to remove the encapsulation layer located on the sacrificial layer.

In an embodiment of the present disclosure, a portion, located on a side away from the display region of the crack stop slit furthest from the display region, of the encapsulation layer has a non-uniform thickness.

In an embodiment of the present disclosure, forming the sacrificial layer on the crack stop slit step includes depositing a sacrificial material on the base substrate, coating a photoresist on the sacrificial material, and patterning the sacrificial material using the photoresist as a mask to retain the sacrificial material located on the crack stop slit step to form the sacrificial layer.

In an embodiment of the present disclosure, the sacrificial material includes a fluorine-containing polymer.

In an embodiment of the present disclosure, a content of the fluorine-containing polymer is about 20 wt % to 60 wt %.

In an embodiment of the present disclosure, removing the sacrificial layer includes removing the sacrificial layer using a hydrofluoroether solvent.

In an embodiment of the present disclosure, forming the sacrificial layer on the crack stop slit step includes coating a photoresist on the base substrate, and patterning the photoresist to retain the photoresist located on the crack stop slit step to form the sacrificial layer.

In an embodiment of the present disclosure, a top surface of the sacrificial layer is higher than a top surface of the encapsulation layer located in the crack stop slit.

In an embodiment of the present disclosure, the sacrificial layer has a thickness of about 1.5 μm to 5 μm.

In an embodiment of the present disclosure, a width of the sacrificial layer is the same as a width of the crack stop slit step, and the width of the sacrificial layer is about 3 μm to 20 μm.

In an embodiment of the present disclosure, a buffer layer is disposed between the base substrate and the TFT, and an interlayer dielectric layer is disposed between the buffer layer and the TFT. Forming the at least two crack stop slits includes etching the interlayer dielectric layer located in the non-display region to form the crack stop slit in the interlayer dielectric layer, alternatively, etching the interlayer dielectric layer and the buffer layer located in the non-display region to form the crack stop slit in the interlayer dielectric layer and the buffer layer.

In an embodiment of the present disclosure, prior to forming the at least two crack stop slits, the method further includes forming a planarization layer on the base substrate, forming an anode of the OLED device on the planarization layer, the anode being connected to a source or a drain of the TFT, and forming a pixel defining layer on the planarization layer and the anode. Prior to forming the encapsulation layer, the method further includes forming a light emitting layer of the OLED device on the pixel defining layer, and forming a cathode of the OLED device on the light emitting layer.

In an embodiment of the present disclosure, forming the encapsulation layer includes sequentially forming a first inorganic encapsulation layer, an organic encapsulation layer, and a second inorganic encapsulation layer covering the OLED device on the base substrate. The first inorganic encapsulation layer and the second inorganic encapsulation layer cover the crack stop slit and the sacrificial layer.

In an embodiment of the present disclosure, removing the sacrificial layer to remove the encapsulation layer on the sacrificial layer includes removing the sacrificial layer to remove the first inorganic encapsulation layer and the second inorganic encapsulation layer located on the sacrificial layer.

Another aspect of the present disclosure provides a method for manufacturing an OLED display panel by the above OLED display motherboard. The method includes cutting the OLED display motherboard along a cutting line located within the non-display region. The cutting line is located on a side, away from the display region, of the crack stop slit furthest from the display region.

In an embodiment of the present disclosure, the cutting line spans the encapsulation layer.

Another aspect of the present disclosure provides an OLED display device including the OLED display panel manufactured according to the above-described method.

BRIEF DESCRIPTION OF THE DRAWINGS

In order to illustrate the embodiments of the present disclosure or the technical solutions in the prior art more clearly, the drawings used in the description of the embodiments will be briefly described below. It is obvious that the drawings in the following description are only some embodiments of the present disclosure. Other drawings may be obtained by those skilled in the art according to the drawings without paying any creative efforts.

DETAILED DESCRIPTION

The technical solutions in the embodiments of the present disclosure are clearly and completely described in the following with reference to the accompanying drawings in the embodiments of the present disclosure. It is obvious that the described embodiments are a part of the embodiments of the present disclosure, and not all of the embodiments of the present disclosure. Other embodiments obtained by a person skilled in the art based on the embodiments of the present disclosure without paying any creative efforts belong to the scope of the disclosure.

Figure 1:
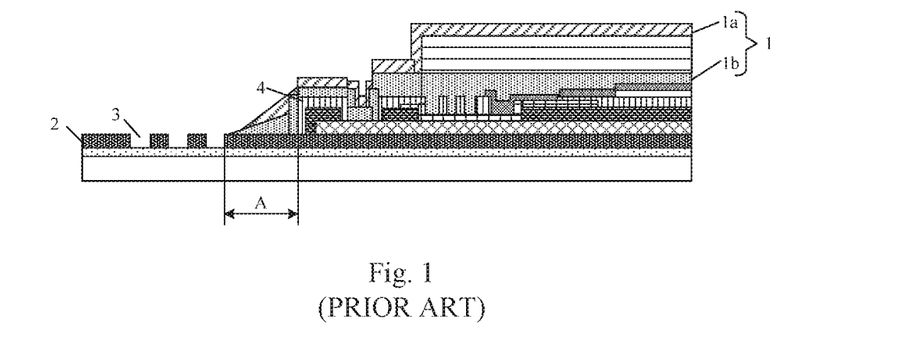
FIG. 1 is a schematic view showing a cross section of a structure of an OLED display motherboard in the prior art.

The short lifetime of the OLED display panel has become one of the important factors limiting their development. The compositions such as moisture and oxygen have a great influence on the lifetime of the OLED display panel. Therefore, in the existing OLED display motherboard, as shown in FIG. 1, an encapsulation layer 1 is usually disposed in the OLED display motherboard to separate respective functional layers in the OLED display motherboard from components such as moisture and oxygen. In addition, in order to ensure that cracks in a first inorganic encapsulation layer 1a and a second inorganic encapsulation layer 1b can be prevented when the OLED display motherboard is cut, a crack stop slit 3 is generally added near a cutting line 2 of the OLED display motherboard, and a deposition boundary of the first inorganic encapsulation layer 1a and the second inorganic encapsulation layer 1b is set between the crack stop slit 3 and a blocking wall 4 of the OLED display motherboard, to prevent the first inorganic encapsulation layer 1a and the second inorganic encapsulation layer 1b from being influenced by the cutting process of the OLED display motherboard. However, since a region A, in which the thicknesses of the first inorganic encapsulation layer 1a and the second inorganic encapsulation layer 1b are non-uniform, is formed during the deposition of the first inorganic encapsulation layer 1a and the second inorganic encapsulation layer 1b, a region corresponding to the region A needs to be left within the frame region of the OLED display motherboard, which results in a larger frame width of the OLED display motherboard.

Embodiments of the present disclosure provide an OLED display motherboard and a method for manufacturing the same, and an OLED display device thereof, which capable of eliminating a non-uniform edge region of a non-display region in an OLED display motherboard and reducing a frame width of the OLED display motherboard.

Figure 2:
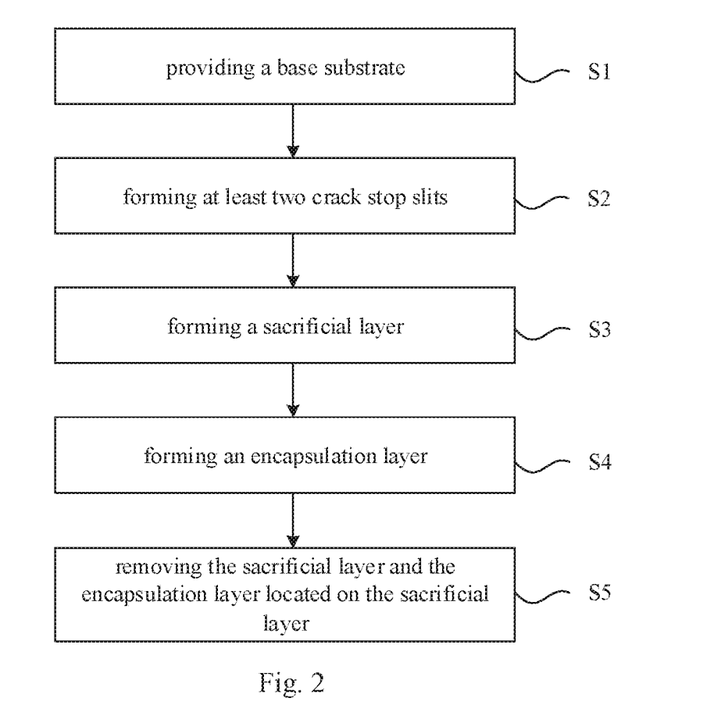
FIG. 2 is a flowchart of a method for manufacturing an OLED display motherboard according to an embodiment of the present disclosure.

Embodiments of the present disclosure provide a method for manufacturing an OLED display motherboard. As shown in FIG. 2, the method for manufacturing an OLED display motherboard includes steps S1 to S5.

Next, an embodiment of the present disclosure will be described in detail with reference to FIGS. 3 to 7.

Figure 3:
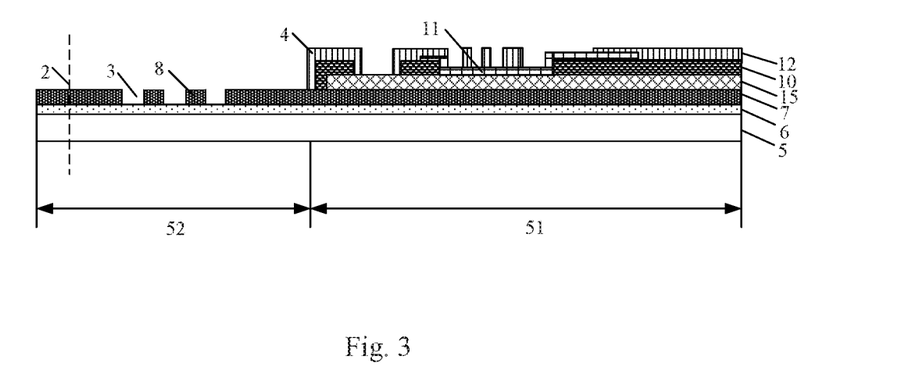
FIG. 3 is a schematic view of a cross section of a first structure obtained after step S2 according to an embodiment of the present disclosure.
Figure 4:
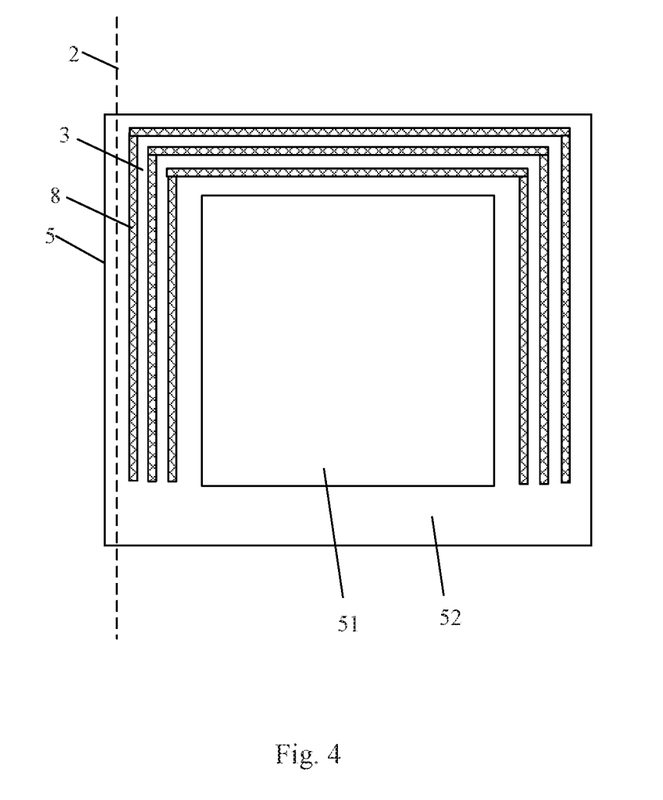
FIG. 4 is a top view of a first structure obtained after step S2 according to an embodiment of the present disclosure.

FIG. 3 is a schematic view of a cross section of a first structure obtained after step S2 according to an embodiment of the present disclosure. FIG. 4 is a top view of a first structure obtained after step S2 according to an embodiment of the present disclosure. Referring to FIGS. 3 and 4, in step S1, a base substrate 5 is provided. The base substrate 5 includes a display region 51 having a TFT 15 and a non-display region 52 surrounding the display region 51. It should be noted that the base substrate 5 provided by the embodiment of the present disclosure may be a glass substrate or other transparent substrate.

For a specific method for forming the TFT 15 on the base substrate 5, reference may be made to a conventional method for forming a TFT, which is not limited in the embodiment of the present disclosure. As an example, in the drawings, the TFT 15 of the embodiment of the present disclosure may include the source/drain electrode layer 15.

With continued reference to FIGS. 3 and 4, in step S2, at least two crack stop slits 3 are formed. Specifically, at least two crack stop slits 3 are formed in the non-display region 52 of the base substrate 5. An extending direction of the crack stop slit 3 is the same as an extending direction of the edge of the display region 51 of the base substrate 5. The adjacent crack stop slits 3 are separated by a crack stop slit step 8.

Figure 5:
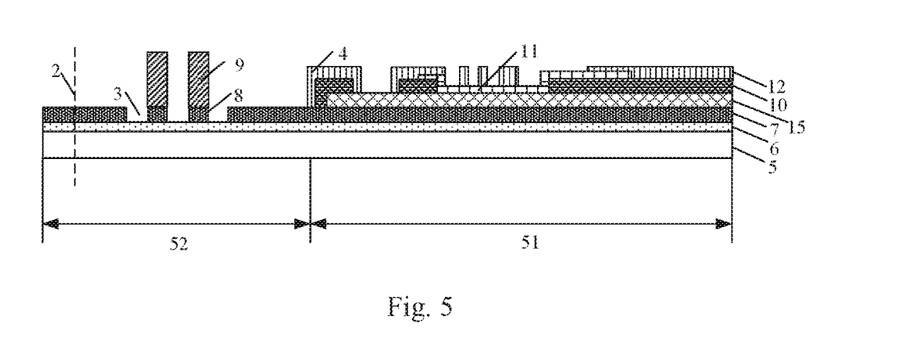
FIG. 5 is a schematic view of a cross section of a structure obtained after step S3 according to an embodiment of the present disclosure.

FIG. 5 is a schematic view of a cross section of a structure obtained after step S3 according to an embodiment of the present disclosure. Referring to FIG. 5, in step S3, a sacrificial layer 9 is formed. Specifically, a sacrificial layer 9 is formed on the crack stop slit step 8. Illustratively, a material of the sacrificial layer may be a polymer such as a transparent resin. In an exemplary embodiment of the present disclosure, a material of a polymer such as a transparent resin may be deposited on the crack stop slit step 8, and then a photoresist is coated on the material, followed by steps of exposing, developing, or etching, so as to form the sacrificial layer 9 on the crack stop slit step 8.

In an embodiment of the present disclosure, the specific shape of the sacrificial layer 9 may be substantially the same as the specific shape of the crack stop slit step 8. For example, the width of the sacrificial layer 9 may be the same as the width of the crack stop slit step 8, may be greater than the width of the crack stop slit step 8, or may be smaller than the width of the crack stop slit step 8, which is not specifically limited in the embodiment of the present disclosure. It should be noted that the above width is a dimension in a direction parallel to a surface of the base substrate 5 and perpendicular to an extending direction of the crack stop slit step 8 or the sacrificial layer 9.

Figure 6:
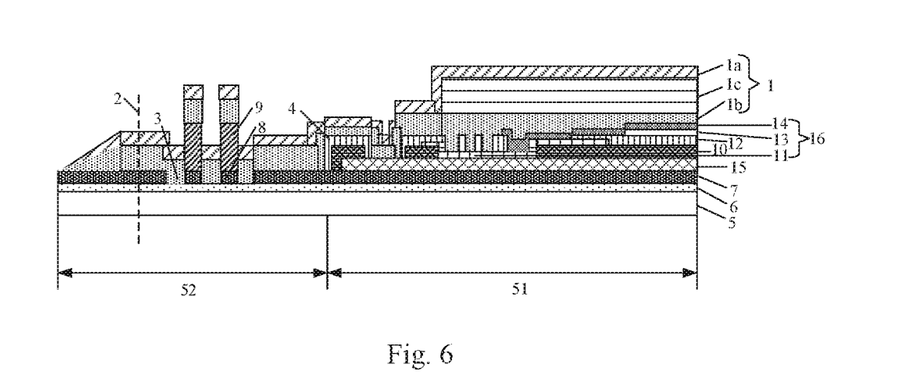
FIG. 6 is a schematic view of a cross section of a structure obtained after step S4 according to an embodiment of the present disclosure.

FIG. 6 is a schematic view of a cross section of a structure obtained after step S4 according to an embodiment of the present disclosure. Referring to FIG. 6, in step S4, an encapsulation layer 1 is formed on the crack stop slit 3, the sacrificial layer 9, and the OLED device 16 of the base substrate 5. Illustratively, the above encapsulation layer 1 may be a single layer of an inorganic film layer or an organic film layer, or may be a multi-layer structure composed of an inorganic film layer and an organic film layer.

Since the crack stop slit 3 is formed in the non-display region 52 of the base substrate 5, in order to enable the encapsulation layer 1 to cover the crack stop slit 3 and the sacrificial layer 9, the edge of the encapsulation layer 1 is located on a side, away from the display region 51, of the crack stop slit 3 furthest from the display region 51.

In the embodiment of the present disclosure, a portion, located on a side away from the display region 51 of the crack stop slit 3 furthest from the display region 51, of the encapsulation layer 1 has a non-uniform thickness.

Figure 7:
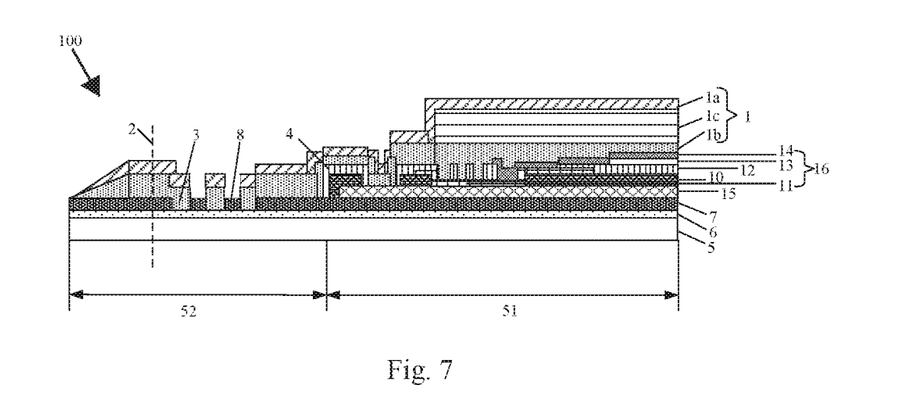
FIG. 7 is a schematic view of a cross section of a structure obtained after step S5 according to an embodiment of the present disclosure.

FIG. 7 is a schematic view of a cross section of a structure obtained after step S5 according to an embodiment of the present disclosure. Referring to FIG. 7, in step S5, the sacrificial layer 9 and the encapsulation layer 1 located on the sacrificial layer 9 are removed.

In the embodiment of the present disclosure, a top surface of the sacrificial layer 9 is higher than a top surface of the encapsulation layer 1 located in the crack stop slit 3.

Illustratively, the sacrificial layer 9 can be decomposed by using a decomposition solvent corresponding to the material of the sacrificial layer 9, to remove the sacrificial layer 9, thereby removing the encapsulation layer 1 located on the sacrificial layer 9.

Embodiments of the present disclosure also provide a method for manufacturing an OLED display panel. The method includes cutting the OLED display motherboard along a cutting line 2 located within the non-display region 52. The cutting line 2 is located on the side, away from the display region 51, of the crack stop slit 3 furthest from the display region 51.

In an embodiment of the present disclosure, the cutting line 2 spans the encapsulation layer 1.

In the method for manufacturing an OLED display motherboard provided by the embodiment of the present disclosure, after the crack stop slit 3 is formed in the non-display region 52 of the base substrate 5, a sacrificial layer 9 is formed on the crack stop slit step 8 between the adjacent crack stop slits 3, and an encapsulation layer 1 is formed on the crack stop slit 3 and the sacrificial layer 9. Since the crack stop slit 3 is formed in the non-display region 52 of the base substrate 5, in order to enable the encapsulation layer 1 to cover the crack stop slit 3 and the sacrificial layer 9, the edge of the encapsulation layer 1 is located on a side, away from the display region 51, of the crack stop slit 3 furthest from the display region 51. That is, during the process of forming the encapsulation layer 1, the edge, having a non-uniform thickness, of the encapsulation layer 1 is also located outside the cutting line 2, and does not appear within the cutted substrate 5. Therefore, when the OLED display panel is manufactured by the method for manufacturing an OLED display panel provided by the embodiment of the present disclosure, it is not necessary to leave an region, located within the frame region of the OLED display motherboard, corresponding to the edge, having a non-uniform thickness, of the encapsulation layer 1, thereby reducing the frame width of the OLED display motherboard.

Further, while the sacrificial layer 9 is removed, the encapsulation layer 1 on the sacrificial layer 9 is removed, such that the encapsulation layer 1 in the vicinity of the cutting line 2 is disconnected from the encapsulation layer on the corresponding OLED device formed on the base substrate 5. Thus, cracks in the encapsulation layer 1 corresponding to the OLED device can be prevented during the cutting process of the OLED display motherboard. Therefore, moisture and oxygen are prevented from penetrating into the OLED device through the crack, thereby improving the lifetime of the OLED display panel.

It should be noted that, comparing to directly forming the encapsulation layer 1 covering the crack stop slit 3 without providing the sacrificial layer 9, and then removing the encapsulation layer 1 located on the crack stop slit step 8 by a patterning process, the effect of the removal of the method, that is, the method of removing the sacrificial layer 9 and the encapsulation layer 1 located on the sacrificial layer 9 after the sacrificial layer 9 is formed on the crack stop slit step 8, provided by the embodiment of the present disclosure is more precise. If the sacrificial layer 1 is not provided, during the process of removing the encapsulation layer 1 located on the crack stop slit step 8, other portion, which is not required to be removed, of the encapsulation layer 1 may be damaged. Thus, the encapsulation effect of the encapsulation layer 1 may be affected, resulting in moisture and oxygen enter the OLED display motherboard through the damaged position, thereby affecting the lifetime of the OLED display panel.

Illustratively, referring to FIGS. 3 and 5-7, a buffer layer 6 is disposed between the base substrate 5 and the TFT 15, and an interlayer dielectric layer 7 is disposed between the buffer layer 6 and the TFT 15.

In an embodiment of the present disclosure, in the above step S2, the crack stop slit 3 as formed may be located on the buffer layer 6, or may be located on the base substrate 5. Specifically, the specific method for forming the crack stop slit 3 may include the following two.

First, the interlayer dielectric layer 7 located in the non-display region 52 is etched to form the crack stop slit 3 in the interlayer dielectric layer 7. After this step is completed, a structure as shown in FIG. 3 is formed. It can be understood that, when the crack stop slit 3 is formed by the above method, the crack stop slit 3 as formed is penetrated through the interlayer dielectric layer 7, and a bottom surface of the crack stop slit 3 is a side, facing the interlayer dielectric layer 7, of the buffer layer 6.

Figure 8:
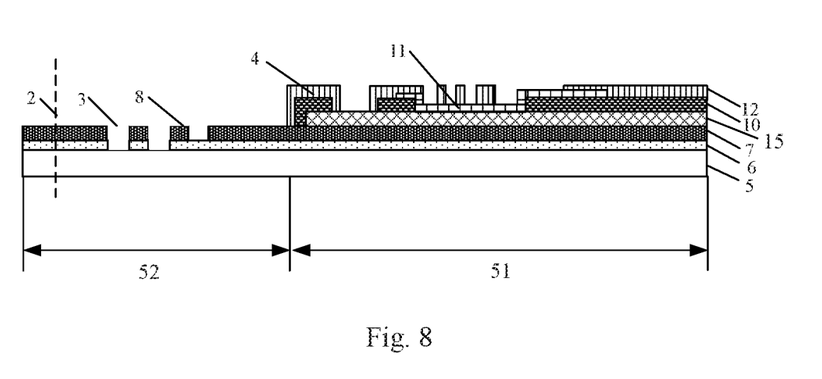
FIG. 8 is a schematic view of a cross section of a second structure obtained after step S2 according to an embodiment of the present disclosure.

Second, the interlayer dielectric layer 7 and the buffer layer 6 located in the non-display region 52 are etched to form the crack stop slit 3 in the interlayer dielectric layer 7 and the buffer layer 6. After this step is completed, a structure as shown in FIG. 8 is formed. It can be understood that when the crack stop slit 3 is formed by the above method, the crack stop slit 3 as formed is penetrated through the buffer layer 6 and the interlayer dielectric layer 7, and a bottom surface of the crack stop slit 3 is a side, facing the buffer layer 6, of the base substrate 5.

In an embodiment of the present disclosure, the step for forming the sacrificial layer 9 on the crack stop slit step 8 may include depositing a sacrificial material on the base substrate 5, coating a photoresist on the sacrificial material, and patterning the sacrificial material using the photoresist as a mask to retain the sacrificial material located on the crack stop slit step 8, to form the sacrificial layer 9.

Illustratively, a sacrificial material such as a polymer may be formed on the base substrate 5 by spin coating, etc., and then a photoresist is coated on the sacrificial material, followed by steps of exposing, developing, etching, etc., to form the sacrificial layer 9 on the crack stop slit step 8.

Further, since the sacrificial layer 9 is also required to be removed in the above step S5, and the fluorine-containing polymer is more easily removed than other polymers, the sacrificial material in the embodiment of the present disclosure may be a fluorine-containing polymer, thereby it is more convenient to remove the sacrificial layer 9.

Further, when a content of fluorine in the above fluorine-containing polymer is higher, the heat resistance, chemical resistance, and durability of the sacrificial layer are better. However, as the content of fluorine increasing, it is more difficult to remove the sacrificial layer, which affects the decomposition of the sacrificial layer 9. Therefore, the content of fluorine in the fluorine-containing polymer in the embodiment of the present disclosure may be about 20 wt % to 60 wt %, so that in the case of ensuring the heat resistance, the chemical resistance, and durability of the sacrificial layer 9, the difficulty in removing the sacrificial layer 9 is reduced.

At this time, the sacrificial layer 9 of the fluorine-containing polymer may be removed by using a hydrofluoroether solvent for the fluorine-containing polymer. Illustratively, Novec-7100 solvent, Novec-7200 solvent, Novec-7500 solvent, Novec-71 IPA solvent, Novec-72DE solvent, or Novec-72DA solvent, etc., may be selected so that the decomposition of the sacrificial layer 9 can be more thorough when removing the sacrificial layer 9, and thus the sacrificial layer 9 can be completely removed.

In addition, it should be added that, the photoresist may be directly used as the material of the sacrificial layer, so that the sacrificial layer 9 can be formed only by steps of one-time coating, one-time exposing, and one-time developing. Illustratively, the step for forming the sacrificial layer 9 on the crack stop slit step 8 may include coating a photoresist on the base substrate 5, and patterning the photoresist to retain the photoresist located on the crack stop slit step 8, thus forming the sacrificial layer 9.

It should be added that, as shown in FIG. 6, on the one hand, when the thickness of the sacrificial layer 9 is smaller, the manufacturing process of the sacrificial layer 9 is more difficult; on the other hand, when the thickness of the sacrificial layer 9 is larger, the difficulty in removing the sacrificial layer 9 also increases, affecting the decomposition of the sacrificial layer 9. Therefore, the thickness of the sacrificial layer 9 in the embodiment of the present disclosure may be about 1.5 µm to 5 µm, to reduce the difficulty of the manufacturing process of the sacrificial layer 9 while reducing the difficulty in removing the sacrificial layer 9.

Illustratively, as shown in FIG. 5, the width of the sacrificial layer 9 may be the same as the width of the crack stop slit step 8, and the specific values of the width of the sacrificial layer 9 and the width of the crack stop slit step 8 may be determined by considering the following two aspects: n the one hand, when the width of the sacrificial layer 9 is smaller, the manufacturing process of the sacrificial layer 9 is more difficult; on the other hand, when the width of the sacrificial layer 9 is larger, the difficulty in removing the sacrificial layer 9 also increases, affecting the decomposition of the sacrificial layer 9. Therefore, the width of the sacrificial layer 9 in the embodiment of the present disclosure is about 3 µm to 20 µm.

In an embodiment of the present disclosure, referring to FIG. 6, the step for forming the encapsulation layer 1 may include sequentially forming a first inorganic encapsulation layer 1a, an organic encapsulation layer 1c, and a second inorganic encapsulation layer 1b covering the OLED device 16 on the base substrate 5. The first inorganic encapsulation layer 1a, the organic encapsulation layer 1c, and the second inorganic encapsulation layer 1b cover the OLED device. The first inorganic encapsulation layer 1a and the second inorganic encapsulation layer 1b cover the crack stop slit and the sacrificial layer.

Further, referring to FIG. 7, after the encapsulation layer 1 is formed, the step for removing the sacrificial layer 9 to remove the encapsulation layer 1 located on the sacrificial layer 9 may specifically include removing the sacrificial layer 9 to remove the first inorganic encapsulation layer 1a and the second inorganic encapsulation layer 1b located on the sacrificial layer 9.

It should be noted that, as shown in FIG. 6, since the encapsulation layer 1 located on the crack stop slit step 8 is disconnected from the encapsulation layer 1 in the crack stop slit 3, that is, a part of the sacrificial layer 9 is exposed, during the process of removing the sacrificial layer 9 as described above, after the sacrificial layer 9 is dissolved by the solvent, the encapsulation layer 1 located on the sacrificial layer 9 is peeled off, that is, the encapsulation layer 1 located on the sacrificial layer 9 is simultaneously removed. Therefore, there is no need to separately remove the encapsulation layer 1 by etching, etc., so that the difficulty in removing the encapsulation layer 1 can be reduced.

In addition, referring to FIG. 3, before the step S2 as described above, that is, before forming the crack stop slit 3, the above method for manufacturing the OLED display motherboard may further include forming a planarization layer 10 on the base substrate 5, forming an anode 11 of the OLED device 16 on the planarization layer 10, the anode 11 being connected to the source or the drain of the TFT 151, and forming a pixel defining layer 12 on the planarization layer 10 and the anode 11.

Illustratively, a material of the planarization layer 10 may include a material such as a transparent insulating resin, etc.

Illustratively, a material of the anode 11 may include a material such as ITO (indium tin oxide).

Illustratively, a material of the pixel defining layer 12 may include an inorganic affinity material (the affinity material is attractive to the solution of the organic light emitting material) and an organic hydrophobic material (the hydrophobic material is repulsive to the solution of the organic light emitting material).

In addition, referring to FIG. 6, before the encapsulation layer 1 is formed, the method for manufacturing an OLED display motherboard provided by the embodiment of the present disclosure may further include forming a light emitting layer 13 of the OLED device 16 on the pixel defining layer 12, and forming a cathode 14 of the OLED device 16 on the light emitting layer 13.

Illustratively, the light emitting layer 13 can be formed by a method such as inkjet printing.

It should be added that the above OLED device 16 may further include a hole transport layer and a hole injection layer located between the light emitting layer 13 and the anode 11 and an electron transport layer and an electron injection layer located between the light emitting layer 13 and the cathode 14. A person skilled in the art can refer to the manufacturing method for the hole transport layer, the hole injection layer, the electron transport layer, and the electron injection layer in the existing OLED device, which will not be described in the embodiments of the present disclosure.

Further, embodiments of the present disclosure provide an OLED display motherboard. As shown in FIG. 7, the OLED display motherboard 100 includes a base substrate 5 having a display region 51 and a non-display region 52 surrounding the display region 51, a TFT 15, and an OLED device 16 located within the display region 51 on the base substrate 5, at least two crack stop slits 3 located within the non-display region 52 of the base substrate 5, an extending direction of the crack stop slit 3 being the same as an extending direction of the display region 51 of the base substrate 5, and the adjacent crack stop slits 3 being separated by a crack stop slit step 8, and an encapsulation layer 1 covering the crack stop slit 3 and the OLED device 16.

In the embodiment of the present disclosure, as shown in FIG. 7, a portion, located on a side away from the display region 51 of the crack stop slit 3 furthest from the display region 51, of the encapsulation layer 1 has a non-uniform thickness. In the embodiment of the present disclosure, the thickness of the outer edge of the above-described portion of the encapsulation layer 1 gradually decreases in a direction away from the display region 51.

It should be added that the above encapsulation layer 1 may be a single layer of an inorganic film layer or an organic film layer, or may be a multi-layer structure composed of a plurality of inorganic film layers and organic film layers. Compared to an OLED display motherboard provided with an encapsulation layer composed of a single layer of an inorganic film layer or an organic film layer, in an OLED display motherboard provided with an encapsulation layer composed of a plurality of inorganic film layers and organic film layers, a path of moisture and oxygen penetrating into the OLED display motherboard is longer and it is more difficult for moisture and oxygen to penetrate into the OLED display mother board. Therefore, as shown in FIG. 7, in the embodiment of the present disclosure, the encapsulation layer 1 includes a first inorganic encapsulation layer 1a, an organic encapsulation layer 1c, and a second inorganic encapsulation layer 1b sequentially stacked. The first inorganic encapsulation layer 1a, the organic encapsulation layer 1c, and the second inorganic encapsulation layer 1b cover the OLED device 16, and the first inorganic encapsulation layer 1a and the second inorganic encapsulation layer 1b cover the crack stop slit 3.

It should be noted that when manufacturing an OLED display panel, a plurality of OLED display panels are usually separately prepared on one large base substrate, and then the large base substrate is cut along a set cutting line 2 (as shown in FIG. 7) by a cutting process, thereby a plurality of independent OLED display panels can be obtained. Therefore, it can be understood that the cutting line 2 can be a cutting line set when cutting a large base substrate in the prior art. In an embodiment of the present disclosure, the cutting line 2 is located within the non-display region 52 of the base substrate 5.

It should be noted that, for a detailed description of related components, reference may be made to the above description of a method for manufacturing an OLED display motherboard, and details are not described herein again.

Further, an embodiment of the present disclosure further provides an OLED display device including the OLED display panel manufactured according to the above method for manufacturing an OLED display panel.

The above is only the specific embodiment of the present disclosure, but the scope of the present disclosure is not limited thereto. Any person skilled in the art can easily think of changes or substitutions within the technical scope disclosed by the disclosure. The changes or substitutions are within the scope of the present disclosure. Therefore, the scope of the present disclosure should be determined by the scope claimed by the claims.

What is claimed is:

1. An OLED display motherboard comprising:
   a base substrate having a display region and a non-display region surrounding the display region;
   an interlayer dielectric layer located on the base substrate located within the display region and the non-display region;
   an OLED device located within the display region of the base substrate on the interlayer dielectric layer;
   at least two crack stop slits located within the non-display region of the base substrate and penetrating through the interlayer dielectric layer, wherein an extending direction of the crack stop slit is the same as an extending direction of an edge of the display region of the base substrate, wherein adjacent crack stop slits are separated by a crack stop slit step, and wherein the crack stop slit step is formed by a portion of the interlayer dielectric layer; and
   an encapsulation layer covering the crack stop slit and the OLED device, wherein a portion of the encapsulation layer, located on a side away from the display region of the crack stop slit furthest from the display region, has a non-uniform thickness.

2. The OLED display motherboard according to claim 1, wherein a thickness of an outer edge of the portion of the encapsulation layer gradually decreases in a direction away from the display region.

3. The OLED display motherboard according to claim 1, wherein the encapsulation layer comprises a first inorganic encapsulation layer, an organic encapsulation layer, and a second inorganic encapsulation layer sequentially stacked, wherein the first inorganic encapsulation layer, the organic encapsulation layer, and the second inorganic encapsulation layer cover the OLED device, and wherein the first inorganic encapsulation layer and the second inorganic encapsulation layer cover the crack stop slit.

4. A method for manufacturing an OLED display motherboard, the method comprising:
   providing a base substrate comprising a display region having a TFT and a non-display region surrounding the display region;
   forming at least two crack stop slits within the non-display region of the base substrate, wherein an extending direction of the crack stop slit is the same as an extending direction of an edge of the display region of the base substrate, and wherein adjacent crack stop slits are separated by a crack stop slit step;

forming a sacrificial layer on the crack stop slit step;

forming an encapsulation layer to cover the crack stop slit, the sacrificial layer, and an OLED device located within the display region of the base substrate; and removing the sacrificial layer to remove the encapsulation layer located on the sacrificial layer, wherein an interlayer dielectric layer is disposed between the base substrate and the TFT, wherein forming the at least two crack stop slits comprises etching the interlayer dielectric layer located in the non-display region to form the crack stop slit in the interlayer dielectric layer, and wherein the crack stop slit step is formed by a portion of the interlayer dielectric layer.

5. The method according to claim 4, wherein a portion of the encapsulation layer, located on a side away from the display region of the crack stop slit furthest from the display region, has a non-uniform thickness.

6. The method according to claim 4, wherein forming the sacrificial layer on the crack stop slit step comprises:
depositing a sacrificial material on the base substrate;
coating a photoresist on the sacrificial material; and
patterning the sacrificial material using the photoresist as a mask to retain the sacrificial material located on the crack stop slit step to form the sacrificial layer.

7. The method according to claim 6, wherein the sacrificial material comprises a fluorine-containing polymer.

8. The method according to claim 7, wherein a content of the fluorine-containing polymer is about 20 wt % to 60 wt %.

9. The method according to claim 7, wherein removing the sacrificial layer comprises removing the sacrificial layer using a hydrofluoroether solvent.

10. The method according to claim 4, wherein forming the sacrificial layer on the crack stop slit step comprises:
coating a photoresist on the base substrate; and
patterning the photoresist to retain the photoresist located on the crack stop slit step to form the sacrificial layer.

11. The method according to claim 4, wherein a top surface of the sacrificial layer is higher than a top surface of the encapsulation layer located in the crack stop slit.

12. The method according to claim 11, wherein the sacrificial layer has a thickness of about 1.5 µm to 5 µm.

13. The method according to claim 4, wherein a width of the sacrificial layer is the same as a width of the crack stop slit step, and wherein the width of the sacrificial layer is about 3 µm to 20 µm.

14. The method according to claim 4, wherein a buffer layer is disposed between the base substrate and the interlayer dielectric layer, and wherein forming the at least two crack stop slits comprises: etching the interlayer dielectric layer and the buffer layer located in the non-display region to form the crack stop slit in the interlayer dielectric layer and the buffer layer.

15. The method according to claim 4, wherein prior to forming the at least two crack stop slits, the method further comprises:
forming a planarization layer on the base substrate;
forming an anode of the OLED device on the planarization layer, wherein the anode is connected to one of a source and a drain of the TFT; and
forming a pixel defining layer on the planarization layer and the anode, wherein prior to forming the encapsulation layer, the method further comprises:
forming a light emitting layer of the OLED device on the pixel defining layer; and
forming a cathode of the OLED device on the light emitting layer.

16. The method according to claim 4, wherein forming the encapsulation layer comprises:
sequentially forming a first inorganic encapsulation layer, an organic encapsulation layer, and a second inorganic encapsulation layer covering the OLED device on the base substrate,
wherein the first inorganic encapsulation layer and the second inorganic encapsulation layer cover the crack stop slit and the sacrificial layer.

17. The method according to claim 16, wherein removing the sacrificial layer to remove the encapsulation layer on the sacrificial layer comprises removing the sacrificial layer to remove the first inorganic encapsulation layer and the second inorganic encapsulation layer located on the sacrificial layer.

18. A method for manufacturing an OLED display panel using the OLED display motherboard according to claim 1, the method comprising cutting the OLED display motherboard along a cutting line located within the non-display region, wherein the cutting line is located on a side, away from the display region, of the crack stop slit furthest from the display region.

19. The method according to claim 18, wherein the cutting line spans the encapsulation layer.

20. An OLED display panel comprising:
a base substrate having a display region and a non-display region surrounding the display region;
an interlayer dielectric layer located on the base substrate and located within the display region and the non-display region;
an OLED device located within the display region of the base substrate and on the interlayer dielectric layer;
at least two crack stop slits located within the non-display region of the base substrate and penetrating through the interlayer dielectric layer, wherein an extending direction of the crack stop slit is the same as an extending direction of an edge of the display region of the base substrate, wherein adjacent crack stop slits are separated by a crack stop slit step, and wherein the crack stop slit step is formed by a portion of the interlayer dielectric layer; and
an encapsulation layer covering the crack stop slit and the OLED device.

21. The OLED display panel according to claim 20, wherein a portion of the encapsulation layer, located on a side away from the display region of the crack stop slit furthest from the display region, has a thickness smaller than another portion of the encapsulation layer located within the display region.

22. The OLED display panel according to claim 20, wherein a portion of the encapsulation layer, located on a side away from the display region of the crack stop slit furthest from the display region, has a thickness gradually decreasing in a direction away from the display region.

23. The OLED display panel according to claim 20, further comprising a blocking wall located between the crack stop slit and the OLED device in a direction parallel to the base substrate.

* * * * *

UNITED STATES PATENT AND TRADEMARK OFFICE
CERTIFICATE OF CORRECTION

PATENT NO. : 11,081,667 B2  
APPLICATION NO. : 16/333059  
DATED : August 3, 2021  
INVENTOR(S) : Dawei Wang et al.

Page 1 of 1

It is certified that error appears in the above-identified patent and that said Letters Patent is hereby corrected as shown below:

In the Claims

In Claim 14, Column 11, Line 52, delete "comprises: etching" and insert therefor -- comprises etching --.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*